(12) United States Patent
Selwyn et al.

(10) Patent No.: US 7,025,856 B2
(45) Date of Patent: Apr. 11, 2006

(54) PROCESSING MATERIALS INSIDE AN ATMOSPHERIC-PRESSURE RADIOFREQUENCY NONTHERMAL PLASMA DISCHARGE

(75) Inventors: Gary S. Selwyn, Los Alamos, NM (US); Ivars Henins, Los Alamos, NM (US); Jaeyoung Park, Los Alamos, NM (US); Hans W. Herrmann, Los Alamos, NM (US)

(73) Assignee: The Regents of the University of California, Los Alamos, NM (US)

(*) Notice: Subject to any disclaimer, the term of this patent is extended or adjusted under 35 U.S.C. 154(b) by 0 days.

(21) Appl. No.: 09/776,086

(22) Filed: Feb. 2, 2001

(65) Prior Publication Data

US 2005/0199340 A1    Sep. 15, 2005

(51) Int. Cl.
*C23F 1/00*      (2006.01)
*H01L 21/306*    (2006.01)
*C23C 16/509*    (2006.01)

(52) U.S. Cl. .................. 156/345.43; 156/345.44; 156/345.45; 156/345.46; 156/345.54; 156/345.55; 118/723 R; 118/718; 118/719; 118/723 E; 118/730

(58) Field of Classification Search ............... 118/718, 118/719, 723 R, 47, 50, 715, 723 E, 723 ER, 118/730; 156/345.43–345.47, 345.54–345.55
See application file for complete search history.

(56) References Cited

U.S. PATENT DOCUMENTS

| | | | | |
|---|---|---|---|---|
| 3,959,104 A | * | 5/1976 | Fales | 118/718 |
| 5,053,246 A | * | 10/1991 | Shuttleworth et al. | 427/407.1 |
| 5,180,433 A | * | 1/1993 | Okuda et al. | 118/715 |
| 5,224,441 A | * | 7/1993 | Felts et al. | 118/723 E |
| 5,258,074 A | * | 11/1993 | Okuda et al. | 118/715 |
| 5,364,481 A | * | 11/1994 | Sasaki et al. | 118/719 |
| 5,464,667 A | * | 11/1995 | Köhler et al. | 118/50 |
| 5,595,792 A | * | 1/1997 | Kashiwaya et al. | 118/47 |
| 5,743,966 A | * | 4/1998 | Woolley et al. | 118/723 R |
| 5,961,772 A | | 10/1999 | Selwyn et al. | 118/723 ER |
| 6,044,792 A | * | 4/2000 | Ogawa et al. | 118/718 |
| 6,054,018 A | * | 4/2000 | Denes et al. | 118/719 |
| 6,290,806 B1 | * | 9/2001 | Donohoe | 156/345.3 |
| 6,367,411 B1 | * | 4/2002 | Ogawa et al. | 118/718 |

* cited by examiner

*Primary Examiner*—Rudy Zervigon
(74) *Attorney, Agent, or Firm*—Mark N. Fitzgerald; Milton D. Wyrick

(57) ABSTRACT

Apparatus for the processing of materials involving placing a material either placed between an radio-frequency electrode and a ground electrode, or which is itself one of the electrodes. This is done in atmospheric pressure conditions. The apparatus effectively etches or cleans substrates, such as silicon wafers, or provides cleaning of spools and drums, and uses a gas containing an inert gas and a chemically reactive gas.

13 Claims, 4 Drawing Sheets

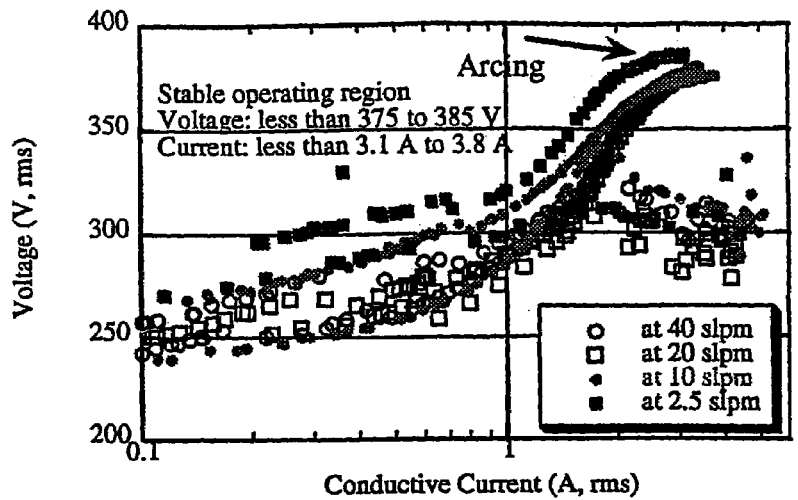
Stable operating region (voltage and current) of atmospheric-pressure plasma discharge for various gas flow rates from 2.5 slpm to 40 slpm at a gas composition of 98% He and 2% O$_2$.
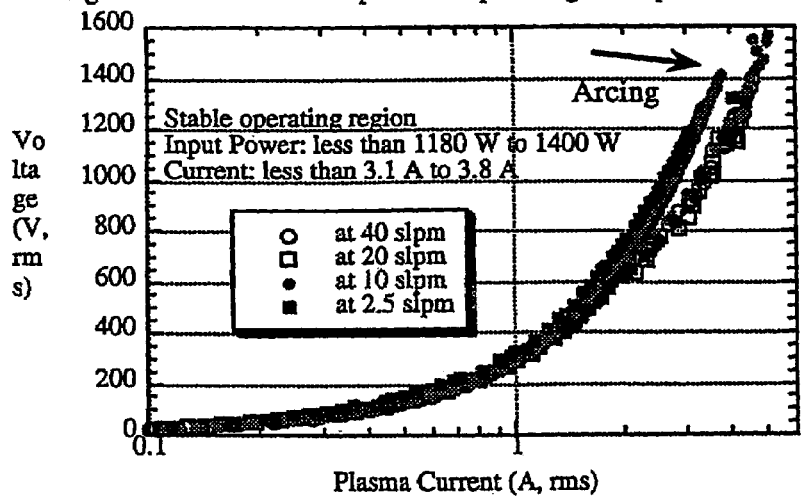
Stable operating region (input power and current) of atmospheric-pressure plasma discharge for varous gas flow rates from 2.5 slpm to 40 slpm at a gas composition of 98% He and 2% O$_2$.

PROCESSING MATERIALS INSIDE AN ATMOSPHERIC-PRESSURE RADIOFREQUENCY NONTHERMAL PLASMA DISCHARGE

The present invention generally relates to material processing and, more specifically, to the processing of an object or material by insertion between the electrodes of an atmospheric-pressure radiofrequency nonthermal plasma discharge. This invention was made with Government support under Contract No. W-7405-ENG-36 awarded by the U.S. Department of Energy. The Government has certain rights in the invention.

Surface cleanliness is of vital importance in many industries, not the least of which is the semiconductor industry. Clean substrates and devices are imperative if high quality devices are to be manufactured. Additionally, other applications require that materials be etched in a predetermined manner to effect the desired operation from the material.

Currently, this cleaning or etching is accomplished through a variety of methods. Among these methods are low-pressure plasma processing and atmospheric-pressure RF plasma discharge processing. By utilizing the reaction of the plasma with selected feed gases, surface processing has been performed on organic films, fabrics, and semiconductor wafers. In these processes, the target material is immersed in the plasma, typically by placing the workpiece directly on an electrode.

These discharge processes are effective because of the action of the ions, which typically are more chemically active than the corresponding neutral gas species, due to their greater collision cross section and reaction probability. Also, ions are accelerated across the sheath region in the plasma. This gives rise to the directed flux of positive ions onto the workpiece. The kinetic energy contributed by these ions combined with their chemical of positive ions onto the workpiece. The kinetic energy contributed by these ions combined with their chemical reactivity results in the desired chemical reaction. Unfortunately, however, these prior art processing methods require expensive vacuum systems in order to be effective, because the formation of a sheath is favored by low pressure and to obtain a high kinetic energy of the ions it is necessary to minimize gas-phase collisions within the sheath region.

The primary objective of the present invention, like the prior discipline of low-pressure plasma processing, is to modify selected surfaces. This modification can include contamination removal, surface material removal, known as etching, or changes in the physical state or property of the surface, known as surface modification.

Previous demonstrations of atmospheric pressure, RF plasma discharge that are related to the present invention are U.S. Pat. No. 5,961,772, issued to Gary S. Selwyn for "Atmospheric-Pressure Plasma Jet," and U.S. patent application Ser. No. 09/295,942, filed Apr. 21, 1999, for "Large Area Atmospheric-Pressure Plasma Jet." The first involves a coaxial, cylindrical electrode configuration, and the second a parallel plate electrode configuration. In both of these demonstrations, the plasma by-products are blown out of the source region, in which the plasma is generated, and is directed against a surface to be treated. The target surface is typically a few millimeters from the source.

It should be noted that radicals, and particularly ions, in the plasma discharge are extremely short lived, and cannot be transported for long distances outside the discharge region. Metastable species produced inside the plasma, on the other hand, have longer lifetimes at atmospheric pressure, typically on the order of hundreds of milliseconds. This longer lifetime allows them to be carried out of the plasma volume along with the gas flow and impinge against an external material or surface.

The fast flow of the reactive gas stream exiting the plasma volume increases the reaction distance, that is, the distance at which the plasma jet may be positioned from a workpiece and still provide effective reaction chemistry. High gas flow also increases the flux of reactive species onto the workpiece. To accomplish all of this, high gas flows must be maintained to carry reactive metastable and other plasma species to the workpiece before they decay and become nonreactive. Of course, high gas flow rates increase the cost of plasma processing by increasing the cost of consumables, or require reprocessing of the spent gas.

Such downstream treatment of materials as described also has some distinct advantages. It reduces the likelihood of surface damage to the workpiece, because after exiting the plasma volume, most of the charged species have recombined and are neutralized. One common source of damage in microelectronic devices is due to the build up of charge on dielectric on semiconductor surfaces. Therefore, surface charging is not an issue in downstream processing. Because neutral species are not accelerated to high kinetic energy in the way that ions are in low pressure plasma processing equipment, the reaction chemistry of neutral species is more selective, albeit slower, than ion chemistry.

Clearly, in cases where selectivity is not an important issue, such as the removal of organic contaminants from silicon or metals (because of the innate huge difference in chemical reactivity between the former and the latter two materials), the process rate could be improved by incorporating ion-driven chemistry into the reaction scheme. This may be accomplished through direct immersion of the workpiece into the volumetric plasma.

Because the plasma volume contains significant ionic components, cleaning and surface treatment of materials may be accelerated by utilizing ion-driven chemistry. Also, by immersing the workpiece into the plasma, high gas flow rates are not needed to drive the reactive species several millimeters before they decay or recombine. This is due to the fact that the reactive species are present immediately adjacent to the workpiece because they are formed in the same volume as the workpiece.

This is the thrust of the present invention: to provide means for the utilizing ion chemistry even for a small plasma volume as is present in the plasma jet source described above, but without the added risk of surface damage caused by high energy impact of the ions onto the workpiece. In the present invention the workpiece is introduced directly into the plasma volume and is exposed to the ion and neutral chemistry of the plasma, and to the high-pressure environment of the plasma.

A clear advantage of this approach relative to the prior art of low-pressure plasma processing equipment is that the high-pressure environment of the plasma limits the strength and dimension of the sheath, which in turn limits the kinetic energy of the ions. Ions are accelerated less by the weaker, thinner sheath, and those ions that impinge the surface have lower kinetic energy as a result of the smaller electric field in this sheath, as well as the frequent, gas-phase collisions the ions undergo with neutral species. The resultant lower kinetic energy of ions leads to less surface damage.

An advantage of the direct immersion process taught in this invention relative to the prior art of downstream, atmospheric pressure plasma processing is that the reaction chemistry benefits from the added presence of ions, which would be recombined and therefore lost to the downstream chemistry processing approach. Also, because gas flow is not needed to carry the reactive species several mm to the workpiece, lower gas consumption is possible.

The workpiece may either be as rigid as a silicon wafer or as flexible as manmade or natural textiles. Because the workpiece is exposed to radio frequency power in this invention, there is no limitation that it be conducting at dc power: both dielectric materials and semiconductors, as well as conductors may be processed.

It is therefore an object of the present invention to provide apparatus and method for cleaning and processing materials inside a high-pressure plasma discharge.

It is another object of the present invention to provide apparatus and method for cleaning and processing materials that use less process gas.

It is yet another object of the present invention to provide apparatus and method for treating materials while creating less surface damage to the materials.

It is still another object of the present invention to provide a means of treating materials that may be conductors, semiconductors or dielectric in nature.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the apparatus of this invention for the plasma processing of materials in an atmospheric pressure radio-frequency non-thermal plasma comprises an electrically conductive enclosure defining an interior space with a surface and with openings for introduction of a gas and for entry and exit of a material to be processed, with an electrode situated inside the interior space and spaced apart from the surface of the interior space a distance sufficient to allow placement of the material to be processed. Means for placing the material to be processed is located inside the interior space between the electrode and the electrically conductive enclosure. When a gas is introduced into the interior space through the opening for introduction of a gas and a radio-frequency voltage is applied between the electrically conductive enclosure and the electrode, a plasma is created in the interior space for processing the material to be processed within the electrically conductive enclosure.

In another aspect of the present invention and in accordance with its principles and purposes apparatus for processing materials in an atmospheric pressure radio-frequency non-thermal plasma comprise an electrically conductive enclosure defining an interior space with a surface and inlets for a gas and for entry and exit of a material to be processed with an electrode spaced apart from the electrically conductive enclosure and capable of placing the material to be processed inside the interior space between the electrically conductive enclosure and the electrode, the material to be processed being in contact with the electrode. When a gas is introduced into the inlet for gas and a radio-frequency voltage is applied between the electrically conductive enclosure and the electrode a plasma is created in the interior space for processing the material to be processed as it passes through the electrically conductive enclosure In a still further aspect of the present invention and in accordance with its principles and purposes apparatus for processing materials in an atmospheric pressure radio-frequency non-thermal plasma comprise a grounded enclosure defining a first interior space, gas inlet and outlets and an opening for radio-frequency voltage connection, with a radio-frequency connector in said opening. A radio-frequency electrode is located in the interior space in electrical contact with the radio-frequency connector, and defines an opening for the gas inlet and a second interior space. Grounded means for retaining a spool of material to be processed is in close proximity to the radio-frequency electrode. When a gas is introduced through the gas inlet and a radio-frequency voltage is applied between the radio-frequency connector and ground, plasma is created between the radio-frequency electrode and the spool of material to be processed thereby providing cleaning of the spool of material.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings:

FIGS. 3A and 3B are plots of voltage versus plasma current for several gas flow rates.

DETAILED DESCRIPTION

The present invention provides atmospheric pressure plasma processing of materials in an effective and efficient manner. The invention can be understood most easily through reference to the drawings.

Figure 1:
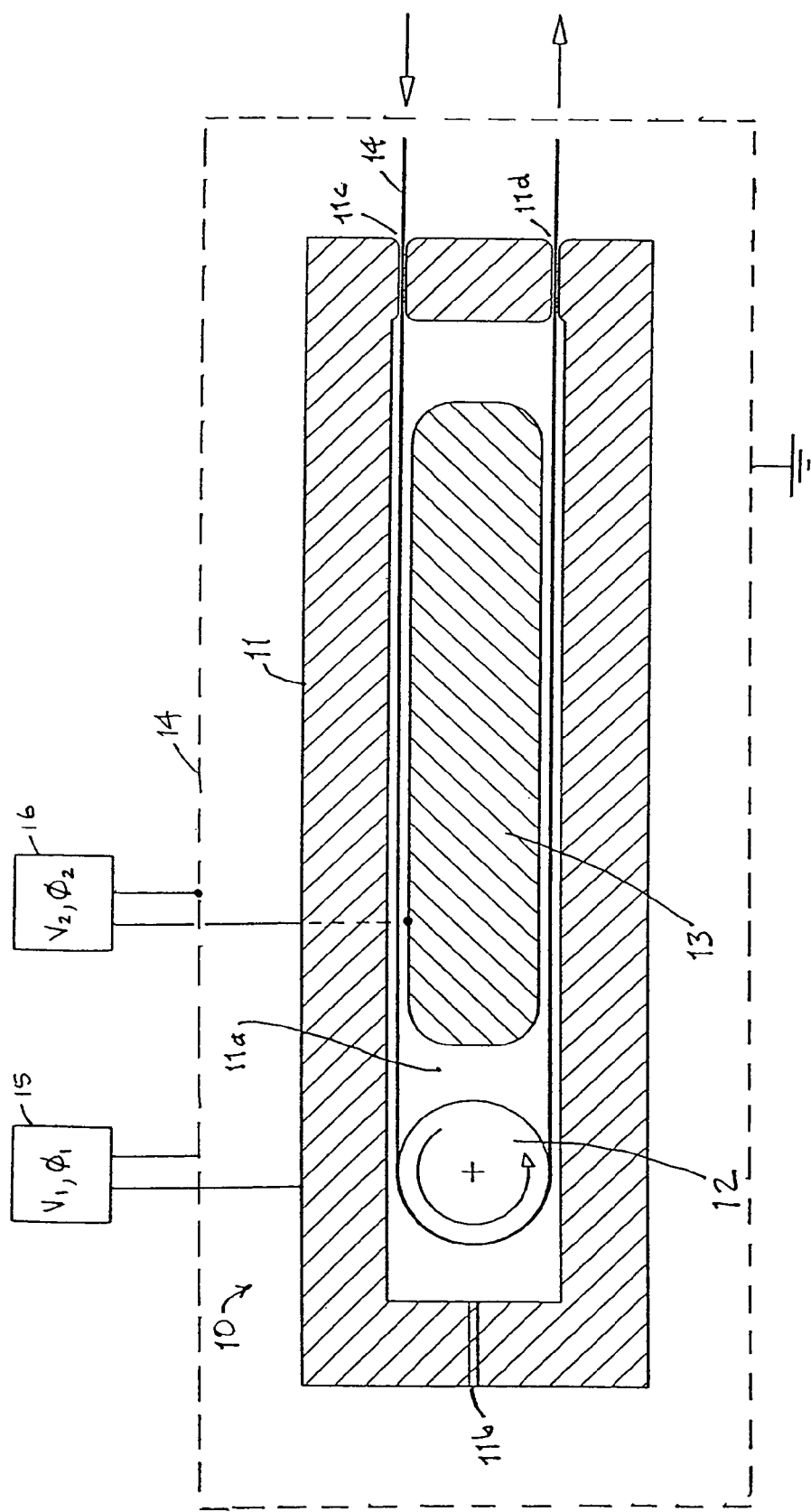
FIG. 1 is a schematic illustration of one embodiment of the present invention in which the material to be processed is pulled by roller through the volume between a ground electrode and a radio frequency electrode.

In FIG. 1 there is a cross-sectional schematic illustration of one embodiment of the invention where material plasma processor 10 defines electrically conductive enclosure 11 that forms an enclosed volume 11a having gas inlet 11b, material inlet 11c and material outlet 11d. Inside volume 11a, roller 12 and electrode 13 are situated. Roller 12 serves to pull film or textile material 14 through enclosed volume 11a between electrically conductive electrode 11 and electrode 12. Those with skill in this art will appreciate that any appropriate means other than roller 12 could be used to transport film material 14 into place inside enclosed volume 11a. Roller 12 could also be the RF powered electrode in some cases.

With an appropriate gas injected through gas inlet 11b and the appropriate level of RF voltage applied either to electrically conductive enclosure or to electrode 13 with respect to the other serving as a ground electrode, a plasma will be created in enclosed volume 11a for processing said film material 14 as it is pulled through ground electrode 11 by roller 12. The appropriate gas used can be any gas that can provide the proper ion-driven chemistry for the intended processing. In normal operations, an inert gas is the major gas component, along with the addition of a reactive gas such as oxygen in an appropriate amount. However, other gases may also be added, subject to the arcing performance of the plasma source. In the preferred embodiment, a gas mixture consisting of 99% helium +1% oxygen at atmospheric pressure is used to remove organic contaminants from metal or silicon surfaces.

The outlet for the gas introduced into enclosed volume 11 may simply be small openings between the components that comprise the electrically conductive enclosure, or they may be tubing used for gas reprocessing or exhaust. This is true for all of the embodiments of the present invention described herein.

It is important to note that in as much as the present invention utilizes RF energy to create a plasma and to process materials, electrically conductive enclosure 11 does not necessarily need to be grounded. In some circumstances it may be desirable to have electrically conductive enclosure 11 floating and apply RF energy 15 at some predetermined phase, which can differ by as much as 180°, with respect to RF energy 16 applied to electrode 13, to enhance the effectiveness of the processing. In this situation, a protective, grounded casing 14, shown by dashed lines in FIG. 1, would enclose the invention for safety reasons. An appropriate frequency for the RF energy used in the present invention is 13.56 Megahertz (MHz), however other RF frequencies might also prove useful.

Figure 2:
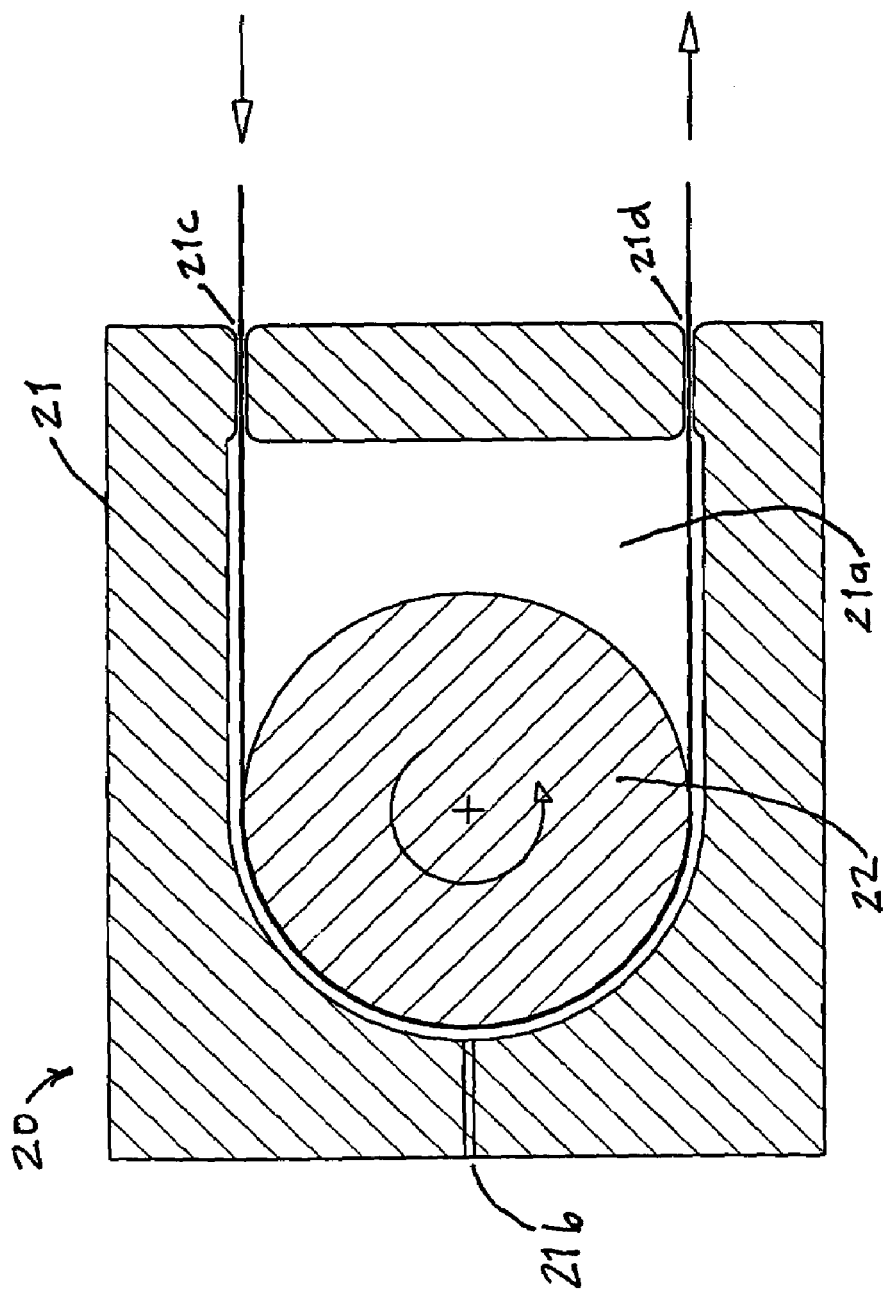
FIG. 2 is a schematic illustration of another embodiment of the present invention in which the radio frequency electrode is used as a roller to pull the material to be processed into the volume between the radio frequency electrode and the ground electrode.

FIG. 2 illustrates another embodiment of the present invention where material plasma processor 20 defines electrically conductive enclosure 21 that forms enclosed volume 21a, gas inlet 21b, and material inlet 21c and material outlet 21d. Inside enclosed volume 21a, electrode 22 also serves as a roller, such as roller 12 of FIG. 1. However, as with the previous embodiment, it is not necessary that electrode 22 be in the form of a roller. Any other appropriate configuration can be used as long as it is capable of placing a material inside enclosed volume 21a, between electrically conductive enclosure 21 and electrode 22, and in contact with electrode 22.

In this embodiment, any material inserted into enclosed volume 21a through material inlet 21c and is placed in or is pulled through enclosed volume 21a by, or on top of electrode 22. In this embodiment, electrode 22 is in direct contact with the material to be processed, making the material the part of the electrode. In this embodiment, the material can receive the full effect of all of the plasma products. It should be noted that even dielectric or semiconducting substrates could become part of electrode 22 and subject to ion impingement, as RF frequency will penetrate such media.

The present invention provides direct immersion of the material into the plasma, providing an important advantage over the plasma processing techniques of the prior art. As an example, the short-lived species present in the plasma volume, such as ions and certain radicals can attack the material's surface because they are present within the diffusion distance of the material's surface. Additionally, since the gas does not need to flow at high velocity in order to carry reactive species beyond the exit of the plasma source, the gas flow rate can be reduced significantly. This results in savings in the cost of the process gas and the overall processing cost.

The overall low gas flow rate of the present invention, a few standard liters per minute (slpm), addresses a limitation of the prior art Atmospheric Pressure Plasma Jet, namely large usage of He gas for maintaining an arc-free discharge. The present invention is based on a study of the discharge electrical properties of the plasma jet as a function of total gas flow rate. As shown in FIGS. 3A and 3B, the stable region of plasma discharge does not change appreciably as the total gas flow rate is decreased from 40 slpm to 2.5 slpm, a factor of 16, with the gas composition remaining constant. These data indicate the existence of a stable region of plasma discharge even at very low gas flow rates, so long as the gas composition remains constant. The gas composition easily can be maintained in an airtight (not a vacuum) environment.

This low gas flow airtight environment is the hallmark of the previously described embodiments of the present invention. Low gas flow rate decreases the cost of the process and makes treatment of relatively low-value added processes, such as textile treatment, economically viable. By insertion of the material to be processed into the plasma discharge zone as is done in the embodiments of the present invention, the maximum benefit of the plasma is achieved. Compared to the prior art Atmospheric Pressure Plasma Jet, which relies on metastable and other long-lived neutral species for chemical reactions outside the jet, the present invention provides in-situ material processing utilizing the full potential of the atmospheric pressure plasma discharge, including charged species or ions, atomic and radical species, as well as potentially the UV radiation emitted by the plasma to aid material processing. Of course, the contribution of the metastable and other long-lived species of the effluent-based plasma treatment of the prior art also is of value to the processing by the present invention, as these are still present within the discharge region.

Referring again to FIG. 2, it should be understood that this embodiment of the present invention, in having the material to be processed in contact with electrode 22, maximizes chemical reactivity of the plasma while at the same time allowing temperature control of the material. This can be accomplished by simply heating or cooling the electrode in contact with the material. This temperature control ability can be used to enhance the rate of chemical reaction or to limit any detrimental side effects such as thermal damage to the material to be processed.

To verify the efficacy of this embodiment, a KAPTON® film was processed through enclosed volume 21a using He at a flow rate of 42 slpm and an $O_2$ flow rate of 0.36 slpm, and an input power of 345 watts. KAPTON® is a flexible, dielectric film comprised of polyimide. The gap spacing between ground and a flat 10 cm by 10 cm stainless steel RF electrode was 0.16 cm. With this configuration, an etch rate of up to 9 mg per minute was measured both for the KAPTON® film between the electrodes and for the KAPTON® film in contact with the electrodes.

Figure 4:
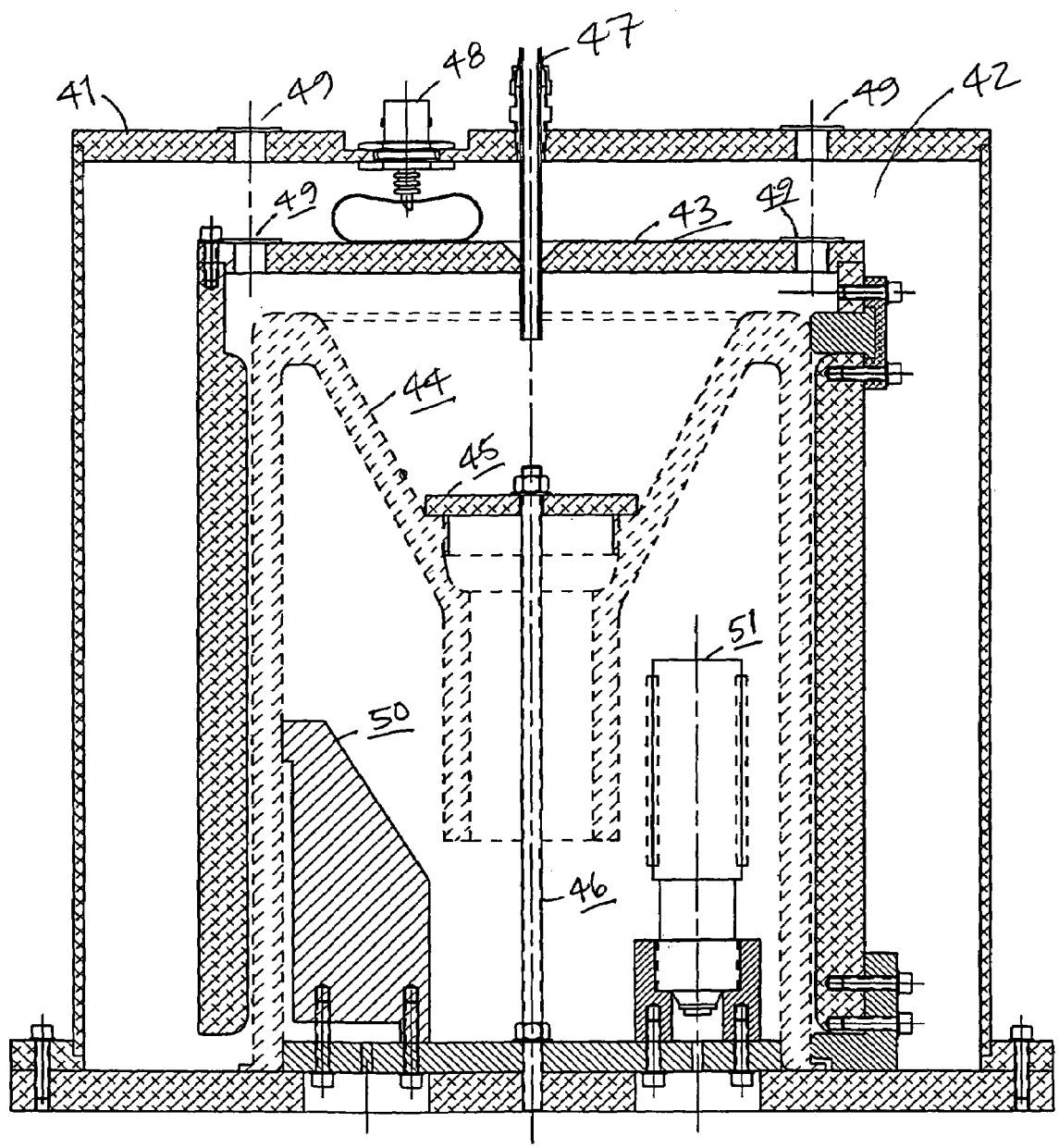
FIG. 4 is an illustration of an embodiment of the present invention employing cylindrical coaxial electrodes.

Another embodiment of the invention is illustrated in a cross-sectional view in FIG. 4, in which outer enclosure 41 defines enclosed volume 42 in which conformal electrode 43 encloses electrically conductive object 44. Electrically conductive object 44 represents any spool or object that is in need of cleaning, such as a printing press roll, or a cylinder intended for recycling from a laser-printing cartridge or a spool used for treatment of thread material in need of cleaning. Electrically conductive object 44 is retained inside conformal electrode 43 by physical connector clamp 45 and threaded shaft 46. In this embodiment, electrically conductive object 44 is grounded and functions as the grounded electrode. In this case, it is preferable to ground electrically conductive object 44 and to position an axially symmetric, RF-powered electrode concentric to electrically conductive object 44 in order to form a plasma. Because electrically conductive object 44 can be grounded, it may be left attached to other equipment without damaging the connected equipment by passage of the RF current. However, in other circumstances, electrically conductive object 44 may be RF powered and conformal electrode 43 may be grounded or may be RF powered at a different phase than is electrically conductive object 44.

Outer enclosure 41 provides an opening for gas tube 47 and for RF connector 48 that provides electrical connection to conformal electrode 43. Outer enclosure 41 also provides viewing ports 49, as does conformal electrode 43. Thermocouple clamp 50 retains a thermocouple for controlling heater 51 for maintaining an appropriate temperature of electrically conductive object 44.

The foregoing description of the embodiments of the invention has been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. Apparatus for processing materials in an atmospheric pressure radio-frequency non-thermal plasma comprising:
   an electrically conductive enclosure defining and interior space with a surface and openings for introductions of a gas and for entry and exit of a material to be processed while said interior space is at or near atmospheric pressure;
   an electrode situated inside said interior space and spaced apart from said surface of said interior space a distance sufficient to allow placement of said material to be processed;
   a mechanical action for placing said material to be processed inside said interior space on said electrode or between said electrode and said electrically conductive enclosure;
   said apparatus enclosed by a grounded casing;
   a first radio frequency power supply having a first phase applied between said electrode and said grounded casing; and,
   a second radio frequency power supply having a second phase offset from said first phase applied between said electrically conductive enclosure and said grounded casing;
   wherein a gas containing a majority of inert gas is introduced into said interior space through said opening for introduction of a gas creating an atmospheric pressure plasma in said interior space for processing said material to be processed within said electrically conductive enclosure.

2. The apparatus as described in claim 1, wherein said mechanical action for placing said material to be processed comprises a roller.

3. The apparatus as described in claim 1, wherein said gas is comprised of an said inert gas and a chemically reactive gas.

4. The apparatus as described in claim 3, wherein said inert gas is helium and said chemically reactive gas contains oxygen.

5. The apparatus as described in claim 1, wherein said first phase has a frequency of 13.56 Megahertz.

6. The apparatus as described in claim 1, wherein said second phase is offset from said first phase by up to 180°.

7. Apparatus for processing materials in an atmospheric pressure radio-frequency non-thermal plasma comprising:
   an electrically conductive enclosure defining an interior space with a surface and inlets for a gas and for entry and exit of a material to be processed while said interior space is at or near atmospheric pressure;
   an electrode spaced apart from said electrically conductive enclosure and capable of placing said material to be processed inside said interior space between said electrically conductive enclosure and said electrode, said material to be processed being in contact with said electrode;
   said apparatus is enclosed by a grounded casing;
   a first radio frequency power supply having a first phase applied between said electrode and said grounded casing; and,
   a second radio frequency power supply having a second phase offset from said first phase applied between said electrically conductive enclosure and said grounded casing;
   wherein a gas containing a majority of inert gas is introduced into said inlet for gas creating an atmospheric pressure plasma in said interior space for processing said material to be processed as said gas passes through said electrically conductive enclosure.

8. The apparatus as described in claim 7, wherein said electrode and said electrically conductive enclosure are cylindrically shaped.

9. The apparatus as described in claim 7, wherein said electrode is a rotating roller.

10. The apparatus as described in claim 7, wherein said gas is comprised of an said inert gas and a chemically reactive gas.

11. The apparatus as described in claim 10, wherein said inert gas is helium and said chemically reactive gas contains oxygen.

12. The apparatus as described in claim 7, wherein said first phase has a frequency of 13.56 Megahertz.

13. The apparatus as described in claim 7, wherein said second phase is offset from said first phase by up to 180°.

\* \* \* \* \*